United States Patent
Söfker et al.

(10) Patent No.: US 8,472,200 B2
(45) Date of Patent: Jun. 25, 2013

(54) LOCKING MECHANISM FOR A HOUSING TO HOLD A PLUG-IN MODULE

(75) Inventors: Jörg Söfker, Lemgo (DE); Frank Best, Bückeburg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 476 days.

(21) Appl. No.: 12/675,179

(22) PCT Filed: Jul. 25, 2008

(86) PCT No.: PCT/EP2008/006104
§ 371 (c)(1),
(2), (4) Date: Feb. 25, 2010

(87) PCT Pub. No.: WO2009/030315
PCT Pub. Date: Mar. 12, 2009

(65) Prior Publication Data
US 2010/0202116 A1     Aug. 12, 2010

(30) Foreign Application Priority Data
Aug. 31, 2007   (DE) .................. 10 2007 041 406

(51) Int. Cl.
*H05K 7/00*      (2006.01)

(52) U.S. Cl.
USPC ......................................... 361/747

(58) Field of Classification Search
USPC ................ 361/747, 726, 759, 725, 740, 749, 361/754, 801
See application file for complete search history.

(56) References Cited

U.S. PATENT DOCUMENTS

| | | | |
|---|---|---|---|
| 4,659,159 A | 4/1987 | Takahashi | |
| 5,253,140 A | 10/1993 | Inoue et al. | |
| 6,551,120 B2 | 4/2003 | Daskalakis et al. | |
| 6,839,239 B1 | 1/2005 | Lee | |
| 2005/0014403 A1* | 1/2005 | Joist | 439/157 |

FOREIGN PATENT DOCUMENTS

DE        3245522 C1       3/1984

OTHER PUBLICATIONS

International Search Report, PCT/EP2008/006104, dated Feb. 13, 2009, 3 pages.
Abstract of DE3245522; Mar. 29, 1984.

* cited by examiner

*Primary Examiner* — Jeremy Norris
*Assistant Examiner* — Tremesha S Willis
(74) *Attorney, Agent, or Firm* — Senniger Powers LLP

(57) ABSTRACT

Locking mechanism (1) and a housing (2) equipped with one such locking mechanism, to hold a plug-in module (5), and a modular system (3) which comprises a housing and a plug-in module, wherein the locking mechanism (1) has an actuating mechanism (4) for unlocking of the plug-in module. The invention is characterized in that the actuating mechanism (4) is connected to a lifting mechanism (6) in order to lift a plug-in module (5) held in the housing (2) when unlocking.

20 Claims, 4 Drawing Sheets

LOCKING MECHANISM FOR A HOUSING TO HOLD A PLUG-IN MODULE

REFERENCE TO RELATED APPLICATION

This application claims priority to German Application 10 2007 041 406.6 filed Aug. 31, 2007.

FIELD OF THE INVENTION

The present invention relates to a locking mechanism and a housing to hold at least one plug-in module, which housing is equipped with such a locking mechanism, and where an actuating mechanism is provided for unlocking the plug-in module.

BACKGROUND

Housings according to the invention preferably hold modular input-output modules, i.e., electric or electronic modules, which are used in control installations or in process automation. The housings here are typically placed on, for example, a mounting and/or carrier rail, and connected with a bus system or a bridge system. One or more plug-in modules are inserted in the housing, so that, when replacing a plug-in module, the appropriate module is pulled out, and a new or appropriate different module can be plugged in. To pull off an inserted module, strong retention forces must often be overcome, because the plug-in connectors with high pole number exert a strong retention force. Therefore, the replacement of individual or multiple plug-in modules is time consuming and laborious.

In addition, as a rule, numerous such housings, designed as carrier housings, for example, are held adjacently to each other in close proximity on a carrier rail, or on another carrier rail. Moreover, several carrier rails can be arranged next to each other, resulting in a whole array of housings equipped with plug-in modules. To reduce the construction space required for such an array, the individual housings sit very close to each other, so that the space available for using tools to remove plug-in modules is rather limited.

In any case, it is necessary to ensure the reliable functioning of the plug-in modules. For this reason as well, housings have been described where the functioning is ensured by locking the inserted plug-in modules, to ensure the functioning. For this purpose, devices have been described in the state of the art, in which a plug-in module is screwed to a housing to allow a secure hold. This disadvantage here is particularly the more complicated disassembly, and also that the user needs to use both hands, one to hold the plug-in module firmly, and the other to turn the screwdriver.

In another known system, a new plug-in module can be inserted into an empty plug-in space, where the latching of the housing of the plug-in module achieves an engagement effect, so that the plug-in module is held securely, and the assembly requires merely a plugging motion along a straight line. However, the disadvantage of this known state of the art is that when replacing a plug-in module, the removal requires, on the one hand, unlocking several connection elements, and, on the other hand, pulling off the unlocked plug-in module against strong retention forces.

In a dense arrangement of a multitude of housings over a surface area, there is only little space between the individual housing, as described above, to insert an unlocking tool or the like, so that, in the state of the art, several unlocking elements usually have to be unlocked, and then the plug-in module needs to be pulled off against the strong retention force.

According to another known state of the art, the plug-in module is inserted without engagement into a plug-in connector, and, to detach the plug-in module, a lever is thrown, pushing the plug-in connector out via a cam or the like. However, the disadvantage of this state of the art is that there is no locking function, so that the loading is unilateral when the plug-in module is pushed out, with the result that the plug-in module is not pushed out along a straight line. This solution as well requires the successive actuation of several mechanisms, to remove a plug-in module, so that the effort required for the disassembly is greater, while at the same time it is not possible to ensure the locking.

Another known solution consists of the arrangement of two release levers which grip the plug-in module symmetrically from below, and push it out of the plug-in connector. The disadvantage of this technical solution is the high cost of the different mechanisms, while, at the same time, no locking occurs.

SUMMARY OF THE INVENTION

Given the indicated state of the art, the problem of the present invention therefore is to provide a locking system for a housing to hold at least one plug-in module as well as a housing equipped with a corresponding locking mechanism, where the locking mechanism or the housing allow the locking, while, on the other hand, a simple assembly and removal of the plug-in module can occur.

This problem is solved by a locking mechanism with the characteristic of Claim 1 and by a housing with the characteristics of Claim 9, and by a modular system having the characteristics of Claim 15. Preferred variants are the object of the dependent claims. Additional advantageous characteristics of the invention are provided in the following description.

DETAILED DESCRIPTION OF PREFERRED EMBODIMENTS

Figure 1:
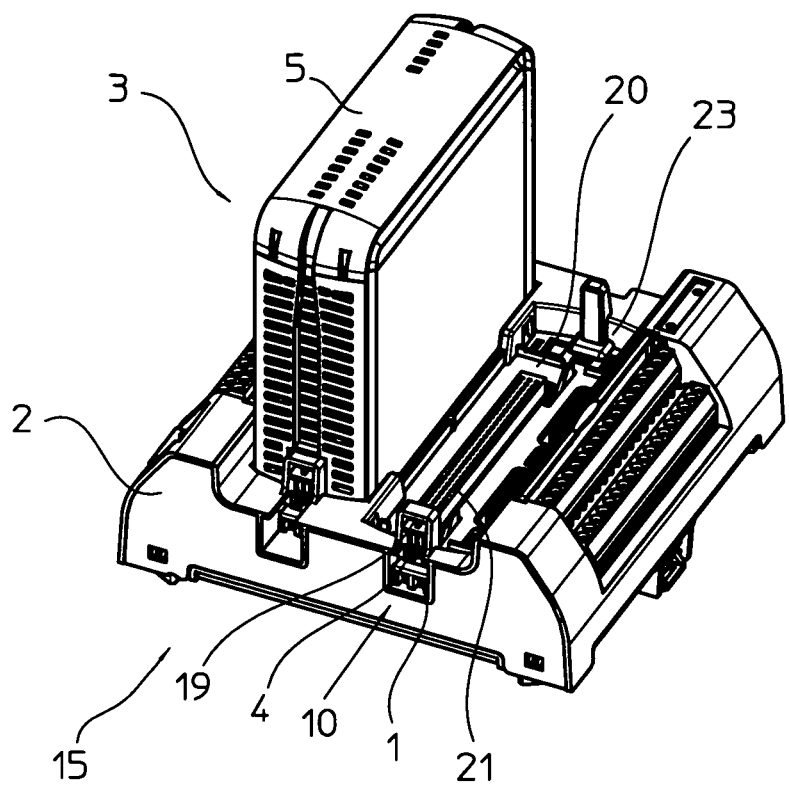
FIG. 1 a perspective view of a housing according to the invention with an inserted plug-in module.

This application claims priority to German Application 10 2007 041 406.6 filed Aug. 31, 2007, the entire disclosure of which is incorporated by reference.

The locking mechanism according to the invention for a housing to hold at least one plug-in module presents an actuating mechanism to unlock the plug-in module. Here, the actuating mechanism is connected to a lifting mechanism whose function is to lift the plug-in module held in the housing when unlocking.

The locking mechanism according to the invention has many advantages. Because the actuating mechanism is connected to the lifting mechanism, the unlocking process lifts any plug-in module that may be held in the associated housing, so that the module can be removed more easily from the housing. Thus, the invention provides not only a locking and unlocking mechanism, the particularly electric or electronic plug-in module is also lifted simultaneously when unlocking to facilitate the removal. This is preferably also possible with connected power supply, so that a rapid replacement of such plug-in modules can occur. In a single work step, it is preferred for both the unlocking and also the ejection of the electronic plug-in module to occur simultaneously.

The invention thus allows easy replacement, while at the same time providing a simple solution. These are considerable advantages, because the piece numbers are often high in such locking mechanisms and associated housings, and the individual cost of the pieces plays an important role.

In the sense of this application, the term "lifting" refers to lifting of the plug-in module out of the housing, so that, after the lifting process, the separation of the plug-in connector, which is held in the housing, of the plug-in module is increased.

Most of the exerted force is thus already overcome when unlocking, particularly at the beginning of the removal process.

In a preferred variant of the locking mechanism according to the invention, the actuating mechanism is moved by translation for the unlocking, where the actuating mechanism is particularly such that it can be moved in only one translational direction. This offers advantages, because the plug-in module is unlocked and lifted in a simple translational or rectilinear movement of the actuating mechanism, to facilitate the removal.

It is preferred for the lifting mechanism to present at least one inclined lifting surface. Here, an inclined lifting surface can be provided, which then acts in particular in the middle, from below, on the plug-in module. To prevent the tilting of the plug-in module, one can provide particularly an external guide of the plug-in module.

It is preferred to use two or more lifting surfaces, where, however, an external guide is already not necessary in any case when using two lifting surfaces and a suitable placement of the lifting surfaces.

The lifting surface is designed particularly as a lifting bevel or an ejection bevel, so that the plug-in module is ejected by the operation of the actuating mechanism.

In advantageous variants, at least one lifting surface presents at least two areas with different slopes, to be able to control the lifting rate, and this particularly the path/force ratio. For the lifting of the plug-in module, the lifting surfaces work in cooperation with corresponding edges on the plug-in module, where, as a result of the translational movement of the actuating mechanism, the inclined lifting surface come in contact with corresponding edges on the plug-in module. During the further translational movement, the plug-in module is lifted by the combined action of the lifting surface with the edge of the plug-in module diagonal to the actuation direction of the actuating mechanism.

The arrangement of two areas with different slopes can advantageously adjust the given speed of the lifting process, and thus particularly the ratio between path and force, in an appropriate way, because the lifting speed is greater in case of a steeper slope, and thus particularly the ratio between path and force is smaller than in the case of a smaller slope.

For the optimal adjustment, it is also possible to provide more than two inclined areas or a curved inclined area, to control the lifting process as desired, which achieves a particularly high flexibility.

In a preferred variant of all the above-described embodiments, a spring device is provided, which preloads the actuating mechanism to a predetermined position. It is preferred for the predetermined position to be the locking position which ensures that no plug-in module is released accidentally.

In all the embodiments, the use of a single actuating mechanism is preferred, where the actuating mechanism acts particularly preferably on several locking elements. Here the action occurs particularly simultaneously, but it can also occur successively on the different locking mechanisms.

In a particularly preferred design, the actuating mechanism forms one piece with at least one locking element and particularly with two or more locking elements. Such an actuating mechanism is advantageous, because all the locking elements present can then be released by the actuation of the actuating mechanism.

In all the embodiments, the lifting mechanism is designed particularly in such a way that during the unlocking a held plug-in module is lifted in a straight line, to prevent twisting of the contacts.

It is advantageous for the actuating mechanism to be designed substantially in the shape of a rod, and to present in each case in the vicinity of both ends a locking element, so that, when a rod-shaped and elongated actuating element is used, a lifting force is applied to the plug-in module at both ends of the actuating mechanism during the unlocking.

It is mentioned here that, in the sense of the application, it is possible for the unlocking and the lifting of the plug-in module to occur simultaneously. During the actuation of the actuating mechanism, it is preferred to carry out first the unlocking, and immediately thereafter the lifting of the plug-in module. For this purpose, the contact surfaces are arranged with offset in the translational direction.

The individual locking elements can be designed as a rear grip or the like, to grip corresponding components of the plug-in modules from the rear.

The housing according to the invention presents at least one module holder to hold at least one plug-in module, and it is equipped with a locking mechanism which comprises an actuating mechanism. Here, the plug-in module is designed in such a way that both locking and unlocking are possible. The actuating mechanism is connected to a lifting mechanism, to lift a held plug-in module during the unlocking process.

In it particularly preferred for the housing according to the invention to present a locking mechanism as described above.

The locking mechanism preferably presents in each case two laterally separated locking elements at both ends of the module holder, so that the plug-in module is secured in each case at both end in the module holder.

In all the embodiments, an interconnect device, particularly a circuit board, which presents electrical plug-in connectors that are arranged on the module holder is provided in the housing.

To improve the actuation of the actuating mechanism, the latter preferably presents a pocket to be able to actuate the actuating mechanism with an actuating element, for example, a screwdriver. To facilitate the actuation, it is preferred to provide a counter bearing on the housing or the plug-in module, to allow force transmission, so that the actuating mechanism can be operated easily and reliably. The transmission ratio results from the length of the actuating element.

Moreover, the invention also relates to a modular system which presents a housing and at least one plug-on module held in it, where moreover at least one locking mechanism is provided, which is arranged either on the housing or on the plug-in module. Here the locking mechanism and/or the housing are designed according to one of the above-described embodiments.

For locking or unlocking, the invention allows insertion and pulling along a straight line, where the actuation can occur on one side of the housing in a way that is very space saving. Thus the actuation is possible even if the available space is limited.

The locking mechanism requires few individual parts, and the assembly of the locking unit on the housing or the plug-in module can be achieved in a simple way. In comparison to conventional systems, where the modules are attached with screws, much time is saved, and a lifting or push-out function is integrated, allowing the high retention forces of the multi-pole plug-in connector to be overcome. By means of the pocket or clip or the like provided on the actuating mechanism, a conversion of the movement becomes possible.

It is preferred for the plug-in module to shift, during the insertion into the housing, by means of feet or edges, the locking elements diagonally to the insertion direction against the spring force of the inserted spring. After the module has been inserted to the intended depth into the carrier housing, the feet of the plug-in module release the locking elements so that a locking of the plug-in module occurs. For unlocking, the locking mechanism is moved axially against the spring force, so that the locking elements are released. During the further course of the unlocking movement, the bevels that are provided on the actuating mechanism or on the lifting mechanism push against the corresponding bevels or edges of the plug-in module, so that the plug-in module is pushed out by overcoming the existing contact forces.

Additional advantages and characteristics of the present invention can be obtained from the description of the embodiment example, which is explained below in reference to the drawings in the appendix.

The modular system 3 represented in the perspective view of FIG. 1 comprises a housing 2, a mounted plug-in module 5, and a locking mechanism 1, of which only one end 16 of the actuating mechanism 4 is visible.

The insertion module or plug-in module 5 usually contains at least one interconnect device, particularly a circuit board, with multi-pole plug-in connectors for contacting corresponding counter connectors in the housing 2 which is designed preferably as a carrier housing. The plug-in module 5 is inserted into the housing 2, and fixed there. The insertion movement and the removal movement are linear.

In the embodiment example, the plug-in module 5 here presents feet 24, which present rear grips for the fixation on the locking mechanism. The feet 24 here can present bevels, to shift the locking mechanism 1 during the insertion diagonally to the insertion direction, to allow the joining.

In the embodiment example, at least one circuit board presenting the counter plugs for the plug-in modules 5 is provided here in the housing 2. One locking mechanism 1 is provided for each plug-in module 5.

In the embodiment example, the housing 2 serves to hold two plug-in modules 5, which can be arranged adjacently and parallel to each other. The housing 2 itself is attached in turn to a carrier rail, on which a multitude of such modular systems 3 are arranged. Due to the multitude of modular systems 3 arranged on such a mounting or carrier rail (not shown), the available space for plugging in or pulling off individual plug-in modules 5 is restricted. The invention here offers considerable advantages, because a plug-in module 5 can only be unlocked and lifted by the actuation of the actuating mechanism 4, so that a removal of the plug-in module 5 from the module holder 20 is simple.

During the lifting process, the external guide 23 also serves to allow the lifting movement to run along a straight line.

In the module holder 20, one or more plug-in connectors 21 are provided, which are connected with corresponding plug-in connectors of the plug-in module 5.

In the embodiment example here, the actuation of the actuating mechanism 4 occurs from the side 15. In principle, the actuation can also be carried out from the other side.

Figure 2:
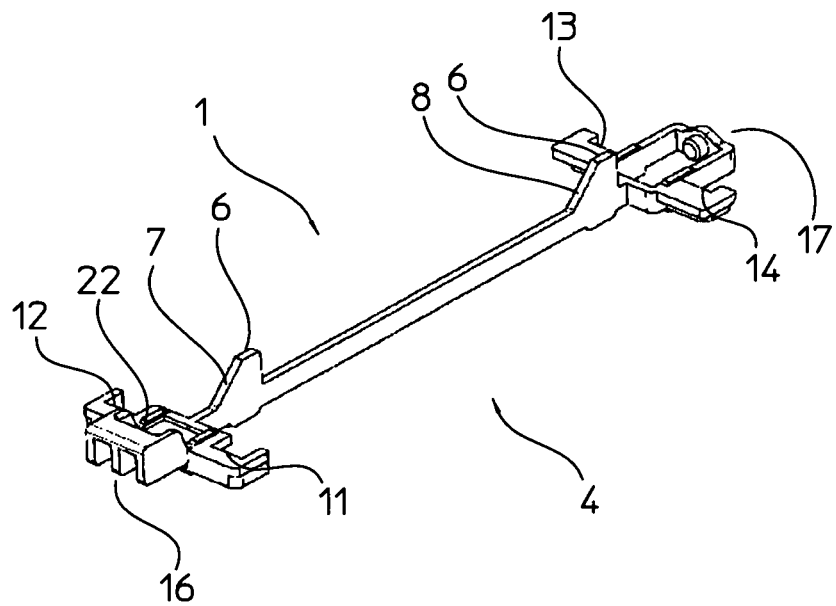
FIG. 2 a locking mechanism according to the invention in a perspective view.

The locking mechanism 1 which is represented in a perspective view in FIG. 2 is substantially designed as an elongated rod, on which the locking element 11, 12 and 13, 14 are arranged in the vicinity of the two ends 16, 17. Here lifting surfaces 7 and 8 of the lifting mechanism 6 are provided in the immediate vicinity of the locking elements. The arrangement of two or more inclined lifting surfaces 7, 8 ensures the introduction and retraction of the plug-in modules 5 along a straight line.

Here, in the embodiment example, the middle area or the actuating mechanism 4 is relatively pliable, and the locking elements 11 and 12 or 13 and 14 are located at the ends of the actuating mechanism 4.

The arrangement and the number of locking elements 11-14 result from the available construction space and the technical requirements. Thus, in other embodiments, only two locking elements are possible as well, or more than four locking elements can also be provided. For unlocking, however, the actuating mechanism is activated from one side. In principle, it is also possible to actuate the actuating mechanism as desired from one or the other side, to allow an even more flexible design. Thus, the actuation is carried out on one side, and the side of the housing can be selected.

During the locking, the locking elements 11, 12 and 13, 14 grip behind appropriately adapted shaped rear grips on the feet of the plug-in module 5, and thus secure the locking position 10 by a positive locking connection.

Figure 3:
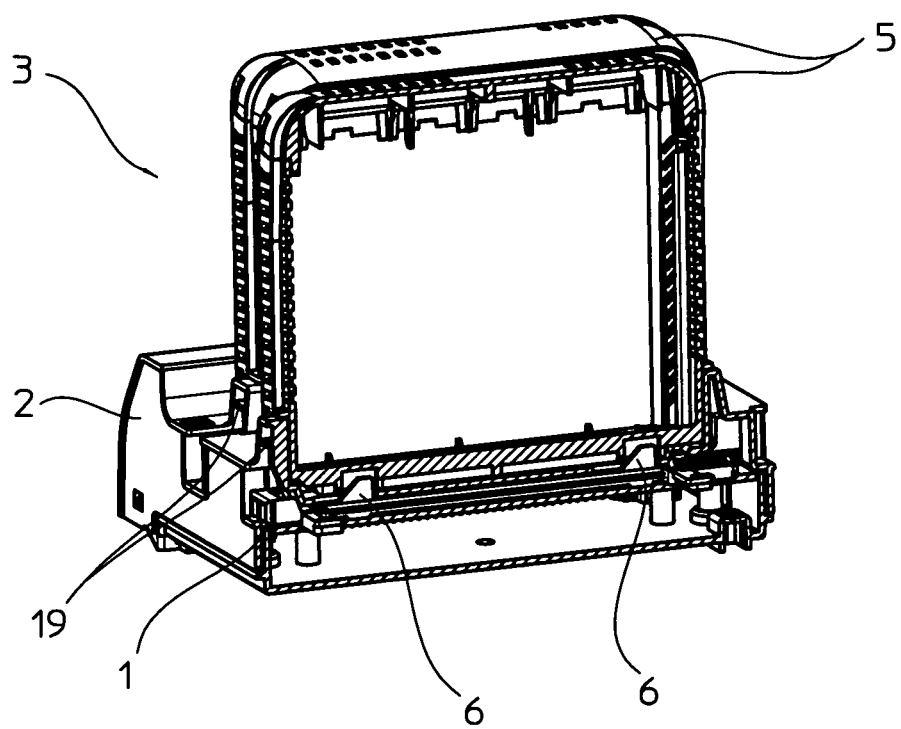
FIG. 3 a partially cross sectional perspective view of the housing with inserted plug-in module.

FIG. 3 shows a partially cut perspective view of the modular system, where the locking mechanism 1 on the housing can be seen. The two lifting surfaces 7, 8 of the lifting mechanism 6 can be clearly seen; they are in each case arranged in the vicinity of the ends 16, 17 of the locking mechanism 1, to ensure a consistent and rectilinear lifting or ejection of the plug-in module.

Figure 4:
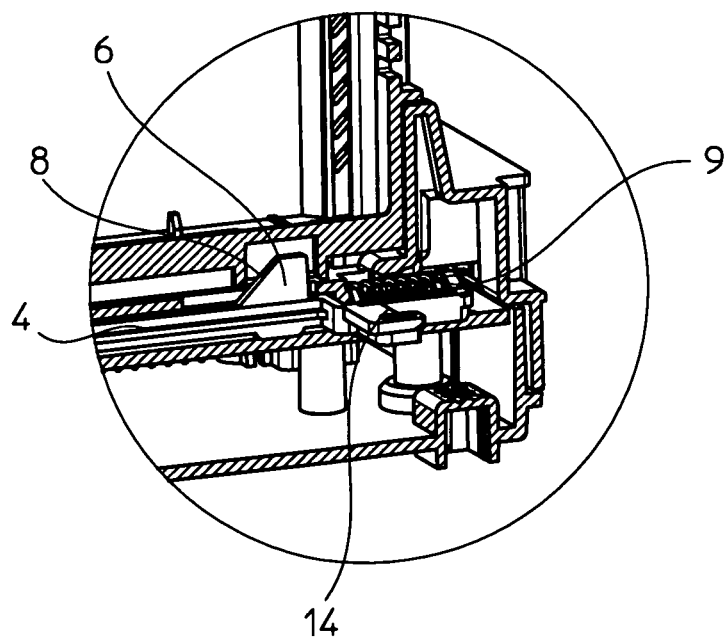
FIG. 4 an enlarged representation of a detail of FIG. 3.

FIG. 4 shows an enlarged section from FIG. 3, where the spring 9 of the locking mechanism 1 can be clearly seen.

The spring 9 serves to hold the locking mechanism in the "O position" or in the locking position in the housing. Moreover, the spring allows a clearance-free hold of the plug-in module 5 in the housing 2. Without such a spring, it would be possible, for example, in the case of occurrence of vibrations, for forces to be applied on the plug-in module 5, which move the plug-in module in the direction of the pull, because the module could be released partially by means of the bevels that are in engagement. The spring allows a preloading which prevents such movements reliably.

Moreover, one advantage of the spring is that the spring holds the locking elements in the locking position independently of the installation situation of the housing and the locking elements, even against the force of gravity.

Figure 5:
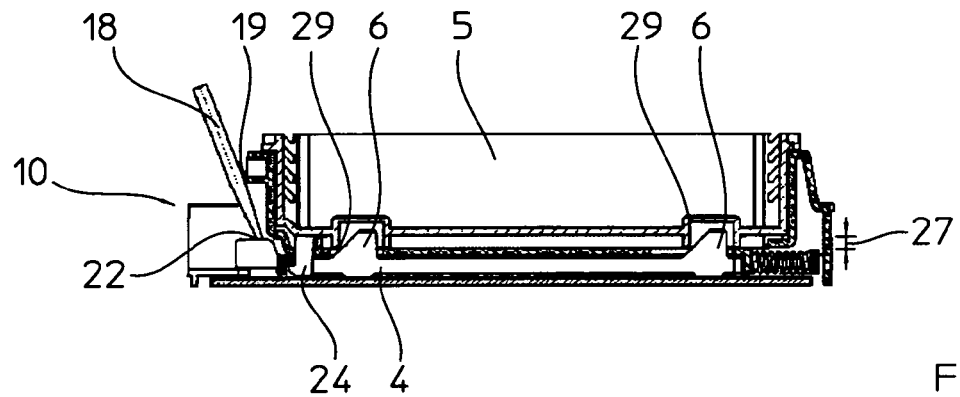
FIG. 5 the housing with an actuating mechanism in a first position.

In reference to FIGS. 5-8, the function of the locking mechanism is now described. The plug-in module 5 is inserted into the housing 2 which is shown in FIG. 5 in a cross sectional side view; it presents holding devices 29 that are not in contact with the lifting surfaces 7, 8 of the lifting mechanism 6 in the locked state. In the locked state shown in FIG. 5, there is a separation 27 between the housing floor and the plug-in module. The unlocking process is started by inserting a screwdriver 18 in the pocket 22 of the actuating mechanism 4, and by applying the screwdriver to the counter bearing 19.

Figure 6:
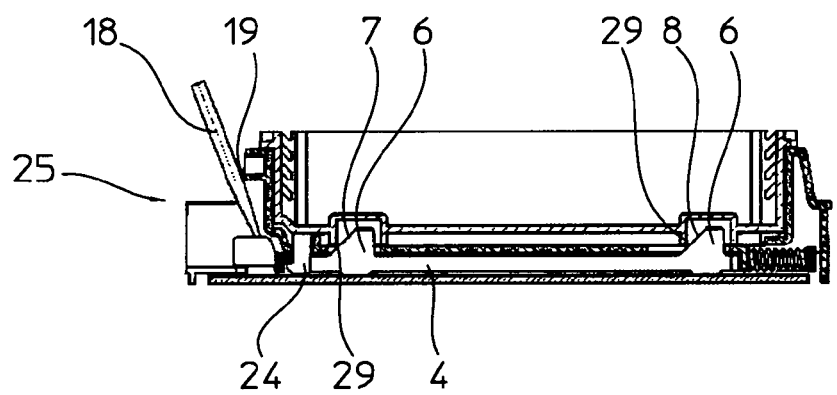
FIG. 6 the housing in a second position during the actuation of the actuating mechanism.

In the position shown In FIG. 6, the screwdriver 18 is pivoted about the counter bearing 19, so that, in the position according to FIG. 6, the locking mechanism 4 is brought in contact at the lifting surfaces 7, 8, with the holding devices 29 of the plug-in module, while the locking elements 11-14 are already released, so that an ejection movement of the plug-in module 5 can occur. During a subsequent further axial movement, the holding devices 29 slide along the inclined lifting surfaces 7, 8, so that the plug-in module 5 is pushed out of the housing.

Figure 7:
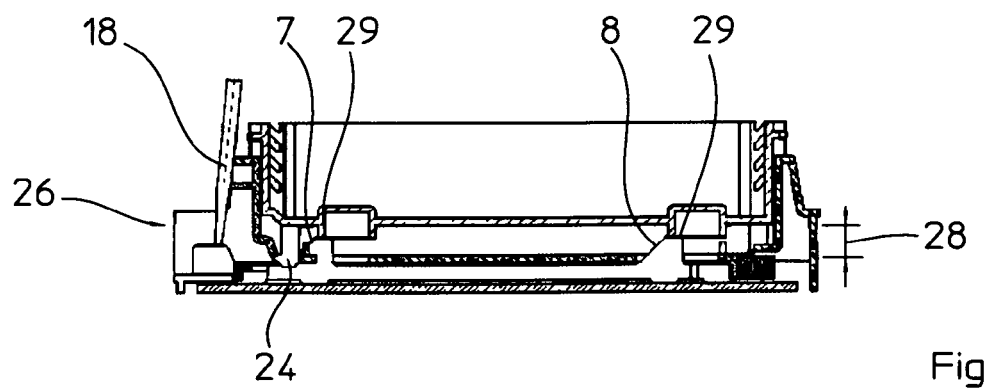
FIG. 7 the housing and the locking mechanism in the unlocking position.

FIG. 7 represents the state where the screwdriver 18, which still engages in the pocket 22, is pivoted until the plug-in module 5 has lifted from the housing 2, so that only a separation 28 now exists, which is clearly greater than the separation 27 represented in FIG. 5.

Figure 8:
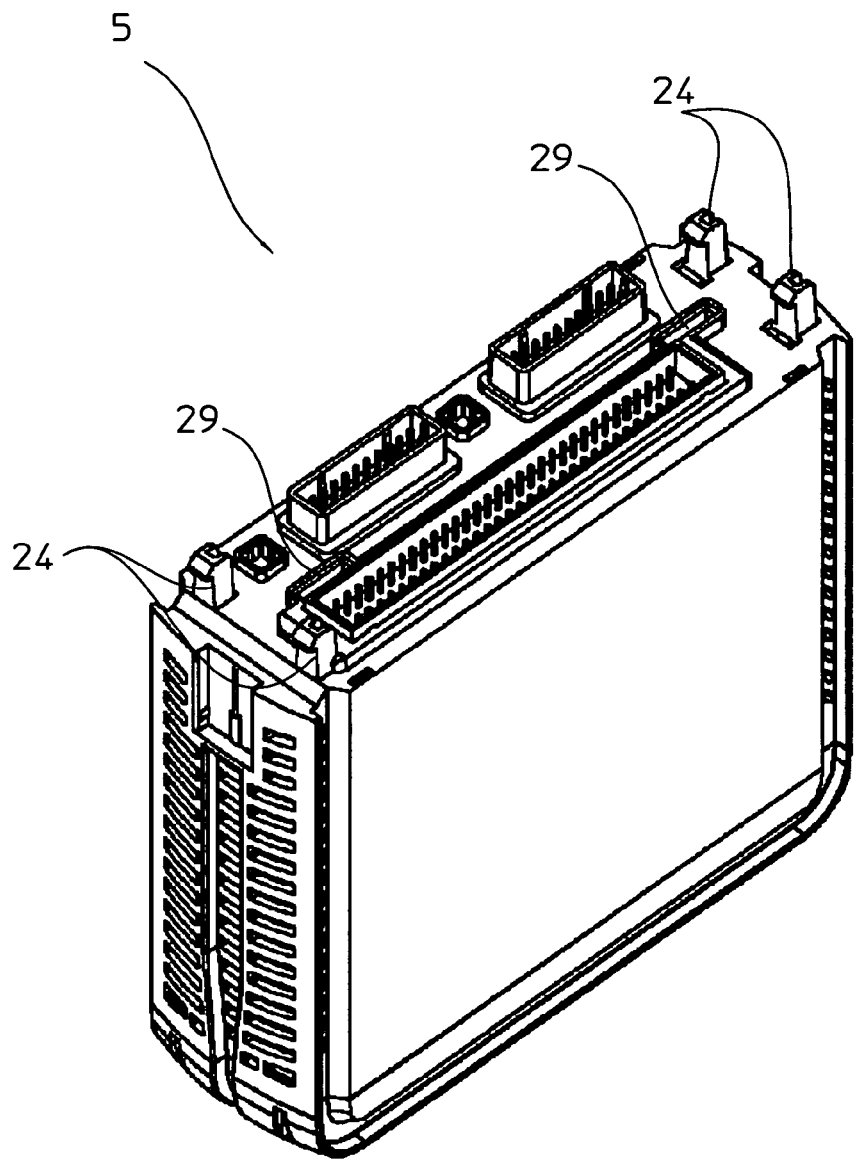
FIG. 8 the plug-in module in a perspective view from below.

FIG. 8 shows the plug-in module in a perspective view from below, where the feet 24 as well as the holding device 29 can be seen clearly.

LIST OF REFERENCE NUMERALS

1 Locking mechanism
2 Housing
3 Modular system
4 Actuating mechanism
5 Plug-in module
6 Lifting mechanism
7 Lifting surface
8 Lifting surface
9 Spring
10 Locking position
11 Locking element
12 Locking element
13 Locking element
14 Locking element
15 Side
16 End
17 End
18 Actuating element
19 Counter bearing
20 Module holder
21 Plug-in connector
22 Pocket
23 External guide
24 Foot
25 $2^{nd}$ position
26 Unlocking mechanism
27 Separation
28 Separation
29 Holding device

The invention claimed is:

1. A locking mechanism for a housing to hold at least one plug-in module having feet, the locking mechanism comprising:
    an actuating mechanism for unlocking feet of a plug-in module,
    a lifting mechanism which is connected to the actuating mechanism,
    at least one inclined lifting surface on the lifting mechanism to lift a plug-in module held in a housing when unlocking,
    wherein the actuating mechanism is movable by translation for unlocking, and
    wherein the actuating mechanism forms a single piece with at least one locking element.

2. The locking mechanism according to claim 1, wherein at least one lifting surface presents at least two areas with different slopes or designed in the shape of curves, to control lifting.

3. The locking mechanism according to claim 1 wherein the actuating mechanism is preloaded with a spring in a locking position.

4. The locking mechanism according to claim 1 wherein the actuating mechanism is substantially rod-shaped, and presents in each case at least one locking element in the vicinity of ends of the locking mechanism.

5. A housing comprising
    at least one module holder to hold at least one plug-in module; and
    a locking mechanism adapted for locking and unlocking a held plug-in module and comprising:
        an actuating mechanism,
        a lifting mechanism which is connected to the actuation mechanism,
        at least one inclined lifting surface to lift a plug-in module held in the housing when unlocking,
        wherein the actuating mechanism is movable by translation for unlocking, and
        wherein the actuating mechanism forms a single piece with at least one locking element.

6. The housing according to claim 5 wherein at least one lifting surface presents at least two areas with different slopes or designed in the shape of curves, to control lifting.

7. The housing according to claim 5 wherein the actuating mechanism is preloaded with a spring in a locking position.

8. The housing according to claim 5 wherein the actuating mechanism is substantially rod-shaped, and presents in each case at least one locking element in the vicinity of ends of the locking mechanism.

9. The housing according to claim 5, wherein the locking mechanism presents in each case two laterally separated locking elements at both ends of the module holder.

10. The housing according to claim 5 comprising a circuit board within the housing which presents electrical plug-in connectors which are arranged on the module holder.

11. The housing according to claim 5 wherein the actuating mechanism presents a pocket to be able to actuate the actuating mechanism with an actuating element.

12. The housing according to claim 5 wherein a counter bearing is provided for the application of the actuating element.

13. A modular system with a housing and at least one plug-in module held on it and with at least one locking mechanism according to claim 1 wherein the locking mechanism is arranged on the housing or on the plug-in module.

14. The modular system of claim 13 wherein at least one lifting surface presents at least two areas with different slopes or designed in the shape of curves, to control lifting.

15. The modular system of claim 13 wherein the actuating mechanism is preloaded with a spring in a locking position.

16. The modular system of claim 13 wherein the actuating mechanism is substantially rod-shaped, and presents in each case at least one locking element in the vicinity of ends of the locking mechanism.

17. The locking mechanism of claim 1 wherein the actuating mechanism is movable by rectilinear movement for unlocking.

18. The housing of claim 5 wherein the actuating mechanism is movable by rectilinear movement for unlocking.

19. The locking mechanism of claim 1 wherein the actuating mechanism is movable in only one translational direction for unlocking.

20. The housing of claim 5 wherein the actuating mechanism is movable in only one translational direction for unlocking.

* * * * *